(12) United States Patent
Wong et al.

(10) Patent No.: US 7,446,603 B2
(45) Date of Patent: Nov. 4, 2008

(54) DIFFERENTIAL INPUT CLASS D AMPLIFIER

(75) Inventors: Shiah Siew Wong, Singapore (SG); Wee Sien Hong, Singapore (SG); Tien Yew Kang, Singapore (SG); Chew Yuan Woong, Singapore (SG)

(73) Assignees: Matsushita Electric Industrial Co., Ltd., Osaka (JP); Panasonic Semiconductor Asia Pte. Ltd., Singapore (SG)

( * ) Notice: Subject to any disclaimer, the term of this patent is extended or adjusted under 35 U.S.C. 154(b) by 58 days.

(21) Appl. No.: 11/465,145

(22) Filed: Aug. 17, 2006

(65) Prior Publication Data

US 2008/0042743 A1    Feb. 21, 2008

(51) Int. Cl.
   *H03F 3/38* (2006.01)
(52) U.S. Cl. ......................................... 330/10; 330/251
(58) Field of Classification Search ................ 330/10, 330/251, 207 A See application file for complete search history.

(56) References Cited

U.S. PATENT DOCUMENTS

| | | | |
|---|---|---|---|
| 4,949,048 A | 8/1990 | Tokumo et al. | |
| 5,767,740 A | 6/1998 | Fogg | |
| 5,815,581 A | 9/1998 | Andersson | |
| 6,262,632 B1 | 7/2001 | Corsi et al. | |
| 6,614,297 B2 * | 9/2003 | Score et al. | 330/10 |
| 7,068,095 B2 * | 6/2006 | Bernardon | 330/9 |
| 7,295,063 B2 * | 11/2007 | Kurokawa | 330/10 |

* cited by examiner

*Primary Examiner*—Henry K Choe
(74) *Attorney, Agent, or Firm*—Greenblum & Bernstein, P.L.C.

(57) ABSTRACT

A differential input Class D audio power amplifier incorporating a differential error amplifier is introduced. In response of differential input signal, this differential error amplifier generates two error signals, which subsequently generates final output signal. This architecture makes it the effect of feedback signal error correction doubled, which helps in achieving good THD. In addition, input port of this architecture is also compatible with single-ended signal. A pop noise suppression technique for this differential input Class D audio power amplifier is also introduced.

22 Claims, 10 Drawing Sheets

DIFFERENTIAL INPUT CLASS D AMPLIFIER

BACKGROUND OF THE INVENTION

Audio Amplifiers

The present invention relates to a pulse width modulation amplifier circuit, and more particularly, to a differential input Class D circuit in which good circuit performance in terms of Power Supply Rejection Ratio (PSRR), Noise, and Total Harmonic Distortion (THD) is achieved.

Most of audio power amplifiers in the market are based on Class AB amplifier. Class AB offers very good total harmonic distortion plus noise (THD+N) performance, with fairly low quiescent current. However, the Class AB push-pull amplifiers are very inefficient and can only achieve an efficiency of about 60%, which results in not only power loss, but also additional bulky heatsink attached to the power amplifiers.

With the advance of fabrication techniques, making integrated Class D audio power amplifier becomes possible. One major advantage of Class D amplifiers is the efficiency, which could reach above 90%. The high efficiency is achieved by full signal swing at power transistors. In a conventional simple Class D amplifier system, the analog input signal such as music signal is converted to a pulse signal, and then this pulse signal is split and passes through level shifter and driver stage to drive output power transistors. The output terminal of the amplifier is connected to the input terminal of the load, such as a loudspeaker via a low-pass filter. Many Class D amplifiers use pulse width modulator to generate pulse trains which vary pulse width in proportion to the audio signal's amplitude. However, some Class D amplifiers may also be configured with other types of pulse modulators, for example, pulse density modulator and self-oscillating modulator.

A balanced transformer-less (BTL) Class D amplifier with feedback circuit 100 is given in FIG. 1, which includes a preamplifier 12, a summing amplifier 14, a triangular wave generator 24, a filter 20, a comparator 22, a latch 28 and an output stage 16. After the input analog signal passing through preamplifier 12, it is applied to the positive port of summing amplifier 14. Output signal is fed back to the negative port of summing amplifier 14. The generated signal from summing amplifier 14 passes through a filter 20, and then is applied to the positive input of comparator 22. The negative input to the comparator 22 is generated by a triangular wave generator 24. The output of the comparator 22 is therefore high when the input signal is higher than the value of the triangular wave 25, and low when the input signal is lower than the value of the triangle wave 25. The output of the comparator 22 is a pulse train with a duty cycle proportional to the instantaneous input signal level. This pulse train is input to a latch 28 which converts the single ended comparator output to a differential signal input to output stage 16, which in turn drives loudspeaker 18. The latch 28 is to ensure no high frequency oscillations, which may occur in the frequency range of comparator state transitions. The latch 28 also ensures that two pulses driving output stage 16 never overlap.

One disadvantage of above BTL Class D amplifier with feedback circuit 100 is its input port configuration, which is only compatible with single-ended audio source. It can not be used for differential input audio source.

To overcome this disadvantage, one method is to design a Class D amplifier with differential input. A simple new architecture with good system stability has to be introduced to provide good noise, Total Harmonic Distortion (THD) and Power Supply Ripple Rejection (PSRR) performance.

Fully Differential Error Amplifier

A difference amplifier is shown in FIG. 2, which is well known in many publications. The differential gain is obtained by proper setting of R1 701, R2 702, R3 703, R4 704 values. However, this commonly used difference amplifier cannot be used for differential output application. Therefore, a fully differential error amplifier has to be designed to cater for the differential input signal, differential output signal and differential feedback signal with proper dc bias design.

Pop Noise Suppression

In an audio amplifier circuit, including Class D amplifier circuit, when turning on the power supply, an unpleasant abnormal sound called pop noise is generally produced and in an even worse scenario the overcurrent protection circuit may be triggered by this generated pop noise.

The pop noise cause for differential Class D amplifier architecture varies. In the proposed differential input Class D amplifier in FIG. 7a, with the absence of the anti pop noise technique, first bias voltage 603 rises up from 0V when startup. As the bias voltage for different blocks are not high enough to enable Class D amplifier to operate normally. The differential output from fully differential error amplifier 280, first error signal 281 and second error signal 282, are not stably defined. They are switching between high and low randomly. Therefore, buzz noise or pop noise at the loudspeaker is heard.

For the same reason, in case of shutdown buzz noise or pop noise at the loudspeaker is heard when bias voltage for different blocks drop to a level that Class D amplifier is not able to operate normally.

Therefore, a method to remove pop noise during startup and shutdown has to be proposed.

SUMMARY OF THE INVENTION

Differential Input Class D Amplifier

The purpose of this invention is to introduce a new and simple differential input Class D architecture, which has good system stability and performance, especially in terms of noise, THD and PSRR. In addition, with an external control switch, this new architecture can be configured to Output transformer-less (OTL) mode. The concept of "Fully Differential" is implemented in this invention, which leads to superior performance for differential input Class D audio amplifier.

According to the present invention, a fully differential error amplifier, which has differential input, is introduced. The fully differential error amplifier is designed to be fully symmetrical to process positive differential input signal and negative differential input signal. This fully differential error amplifier generates first error signal in response to first input signal, first output signal, second input signal and second output signal, and generates second error signal in response to second input signal, second output signal, first input signal and first output signal. Since first error signal and second error signal are a function of first input signal, first output signal, second input signal and second output signal respectively. The linearity of Class D audio amplifier is improved. Therefore, THD is improved.

According to the present invention, one pulse modulator is included in Class D architecture. The pulse modulator generates first pulse signal in response to first error signal and first carrier waveform, and generates second pulse signal in response to second error signal and second carrier waveform.

According to the present invention, the differential input signal is applied to two input unity gain buffers respectively.

The unity gain input has high input impedance. The input referred noise level is also minimized by input unity gain buffer, which in consequence minimizes the output noise level.

According to the present invention, the fully differential architecture of Class D system also helps in achieving good PSRR performance in BTL mode.

According to the present invention, the input port configuration of Class D system is compatible with differential input or single-ended input. Therefore, the term "differential input" mentioned in above description could be single-ended input. The performance of differential input Class D architecture is not sacrificed in case of single-ended input.

Fully Differential Error Amplifier

The purpose of this invention is to design a fully differential error amplifier to process differential input signal, differential output signal and differential feedback signal so that best linearity at differential output is achieved.

This invention describes two embodiments of the circuit implementation for fully differential error amplifier. The first embodiment of a fully differential error amplifier according to the present invention is a common mode feedforward type. In Class D architecture incorporating common mode feedforward fully differential error amplifier, a reference voltage determines the common mode dc level of first output signal and second output signal. The second embodiment of a fully differential error amplifier according to the present invention is a common mode feedback type. In Class D architecture incorporating common mode feedback fully differential error amplifier, common mode feedback circuitry determines the common mode do level of the fully differential error amplifier.

Pop Noise Suppression

One simple and straight forward solution is to enable output stage switching after output bias voltage is fully stored. That is to say, a dc offset between positive differential output signal and negative differential output signal is built up at a very short period, for example, one duty cycle, rather than a long period, the whole startup period. With this arrangement, the frequency of pop noise is moved to a range higher than human audio range. Pop noise suppression is achieved.

However, in the current fully differential input BTL Class D architecture, fully differential error amplifier 280 is dc biased by first bias voltage 603 and the succeeding block, pulse modulator 250, is dc biased by second bias voltage 604. If output stage switching is enabled after first bias voltage 603 is fully stored, fully differential error amplifier 280 is not able to produce either first error signal 235 or second error signal 236, whose dc bias voltage is at second bias voltage 604 in response of feedback pulse and first bias voltage 603 at the input of fully differential error amplifier 280. Therefore, pulse modulator 250 is not able to operate since the input dc voltages are not at the same level.

To overcome above mentioned problem, output stage switching or feedback has to be enabled at proper timing. At this timing, dc offset across the differential output has been sufficient built up so that pop noise in audio range is minimized. At the same time at this time, feedback signal and first bias voltage 603 are still able to produce first error signal 235 or second error signal 236 with a dc bias of second bias voltage 604.

It will be recognized that some or all of the Figures are schematic representations for purposes of illustration and do not necessarily depict the actual relative sizes or locations of the elements shown.

DETAILED DESCRIPTION OF THE PREFERRED EMBODIMENTS

Differential Input Class D Amplifier

Figure 3:
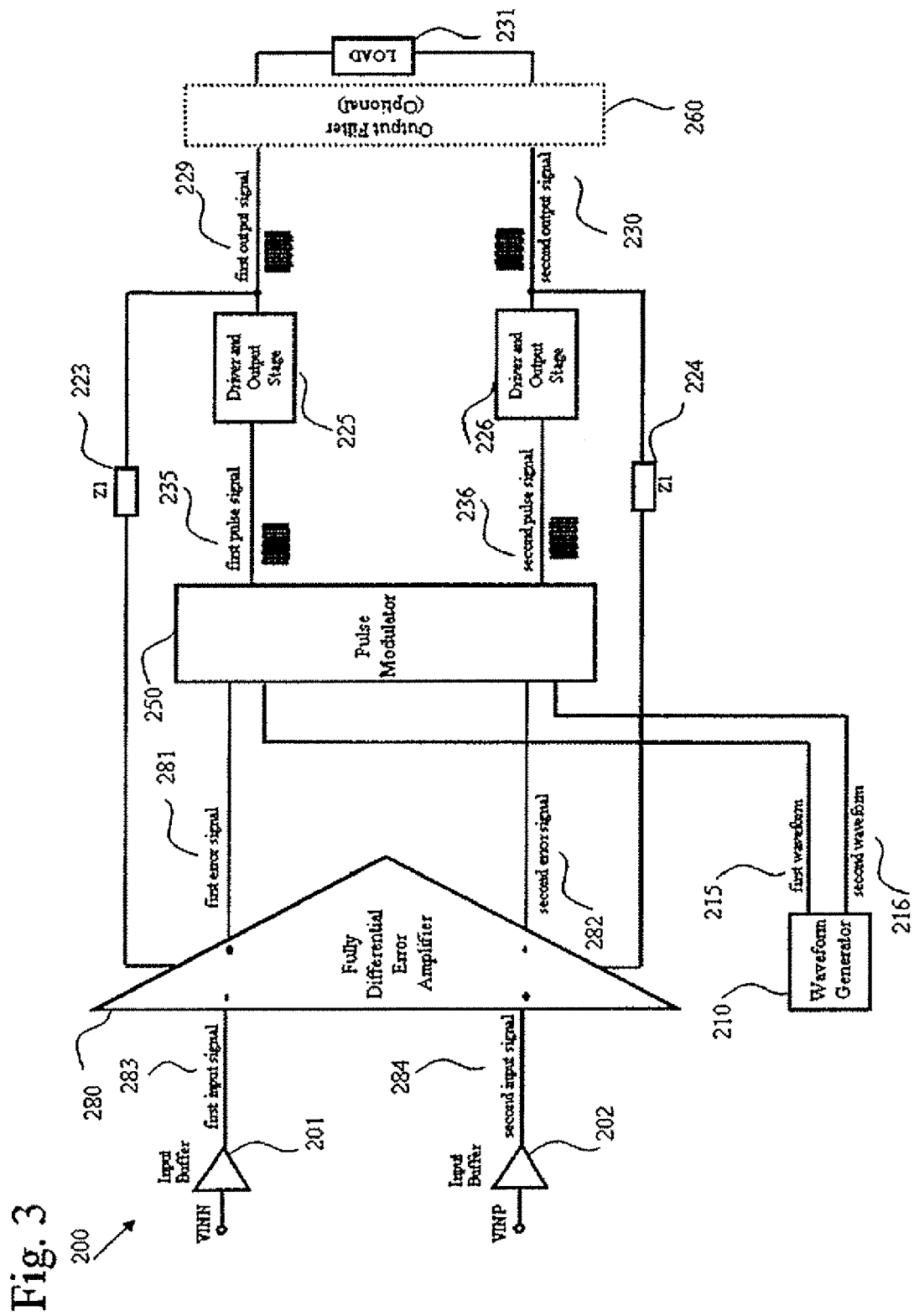
FIG. 3 is a block diagram showing the differential input Class D amplifier with feedback circuit.

Referring to FIG. 3, a differential input Class D amplifier with feedback circuit according to the present invention is shown. The negative differential input signal is applied to input buffer 201 and the positive differential input signal is applied to input buffer 202. Input buffer 201 and input buffer 202 are to minimize the input referred noise level, which in consequence minimizes the output noise level. Input buffer 201 and input buffer 202 generate first input signal 283 and second input signal 284 respectively. First input signal 283 and second input signal 284 are applied to negative input and positive input of fully differential error amplifier 280 respectively.

Figure 1:
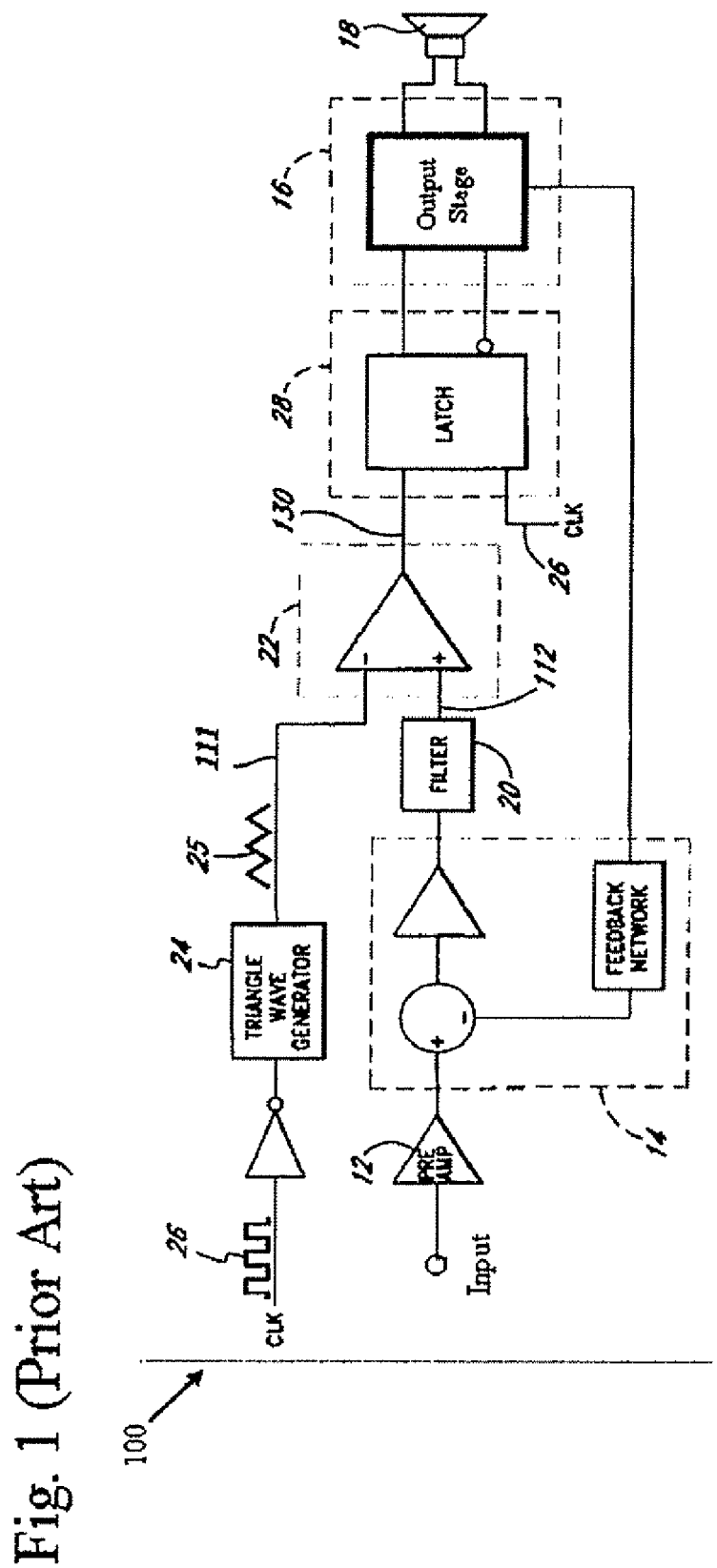
FIG. 1 is a block diagram showing the balanced transformer-less (BTL) Class D amplifier with feedback circuit according to the prior art.
Figure 2:
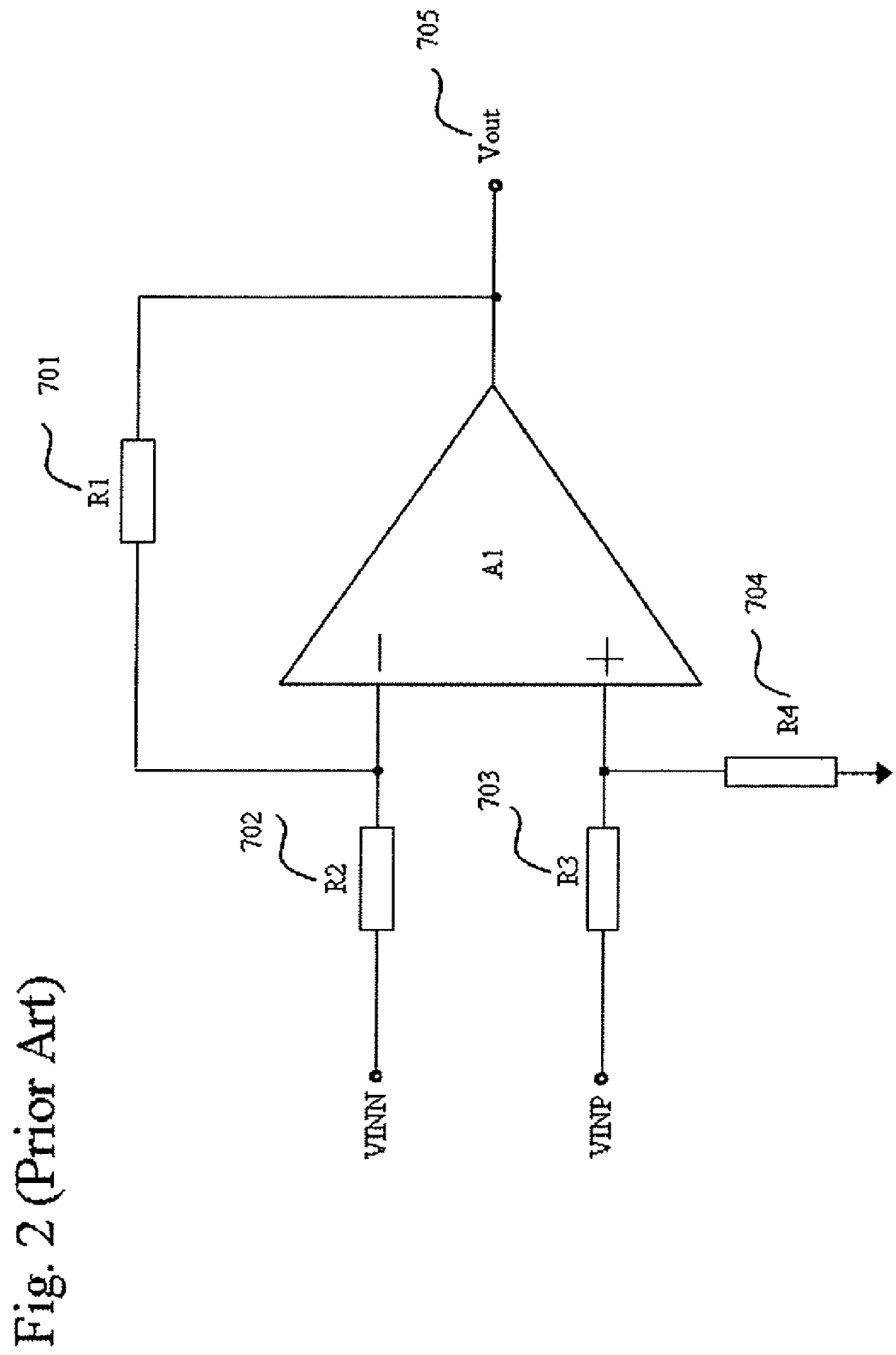
FIG. 2 is a block diagram showing the difference amplifier according to the prior art.

Fully differential error amplifier 280 is shown in FIG. 2. One of its features is that either first error signal or second error signal is generated in response to the differential input signal and the differential output signal. Such a topology makes the effect of feedback signal error correction doubled, which helps in achieving good THD.

The function of fully differential error amplifier 280 is first explained. In response to first input signal 283, first output signal 229, second input signal 284 and second output signal 230, fully differential error amplifier 280 generates first error signal 281. In response to second input signal 284, second output signal 230, first input signal 283 and first output signal 229, fully differential error amplifier 280 generates second error signal 282.

Figure 4:
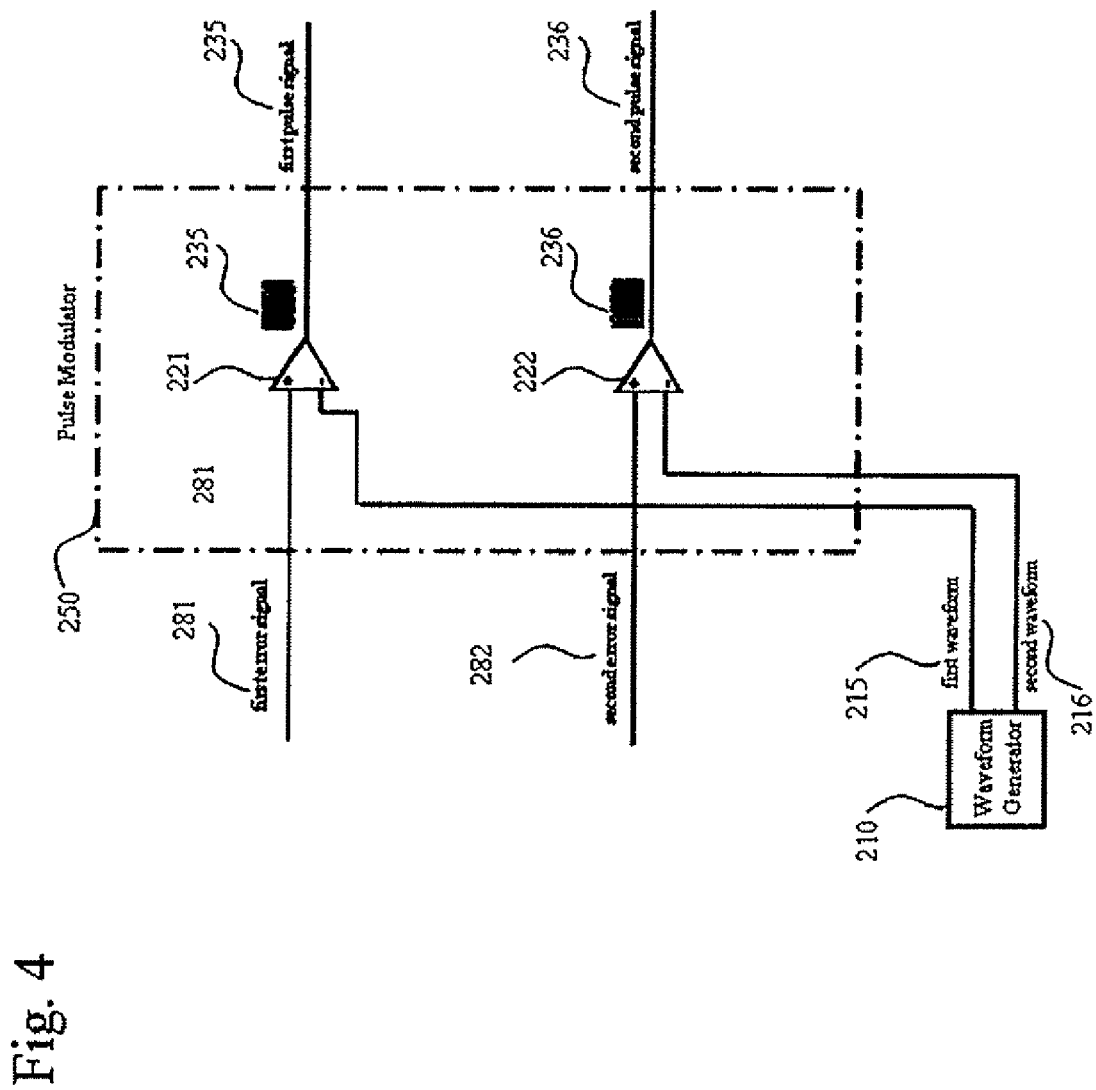
FIG. 4 is a block diagram showing the pulse modulator.

Referring to FIG. 4, waveform generator 210 generates first waveform 215 and second waveform 216. First waveform 215 and second waveform 216 have a fixed phase difference. This fixed phase difference is intended to achieve good THD at final output terminal.

Referring to FIG. 4, pulse modulator 250 comprises a first modulating circuit 221, which generates first pulse signal 235 by comparing first error signal 281 with first waveform 215 and a second modulating circuit 222, which generates second pulse signal 236 by comparing second error signal 282 with first waveform 216.

Referring to FIG. 4, first pulse signal 235 is applied to Driver and Output Stage 225, which subsequently generates first output signal 229. Second pulse signal 236 is applied to Driver and Output Stage 226, which subsequently generates second output signal 230. First output signal 229 and second output signal 230 drives load 231 via Output Filter 260 or drives load 231 directly.

Fully Differential Error Amplifier

The circuit implementation of fully differential error amplifier 280 varies. Fully differential error amplifier 280 can be implemented in either common mode forward type or common mode feedback type.

First Embodiment

Figure 5:
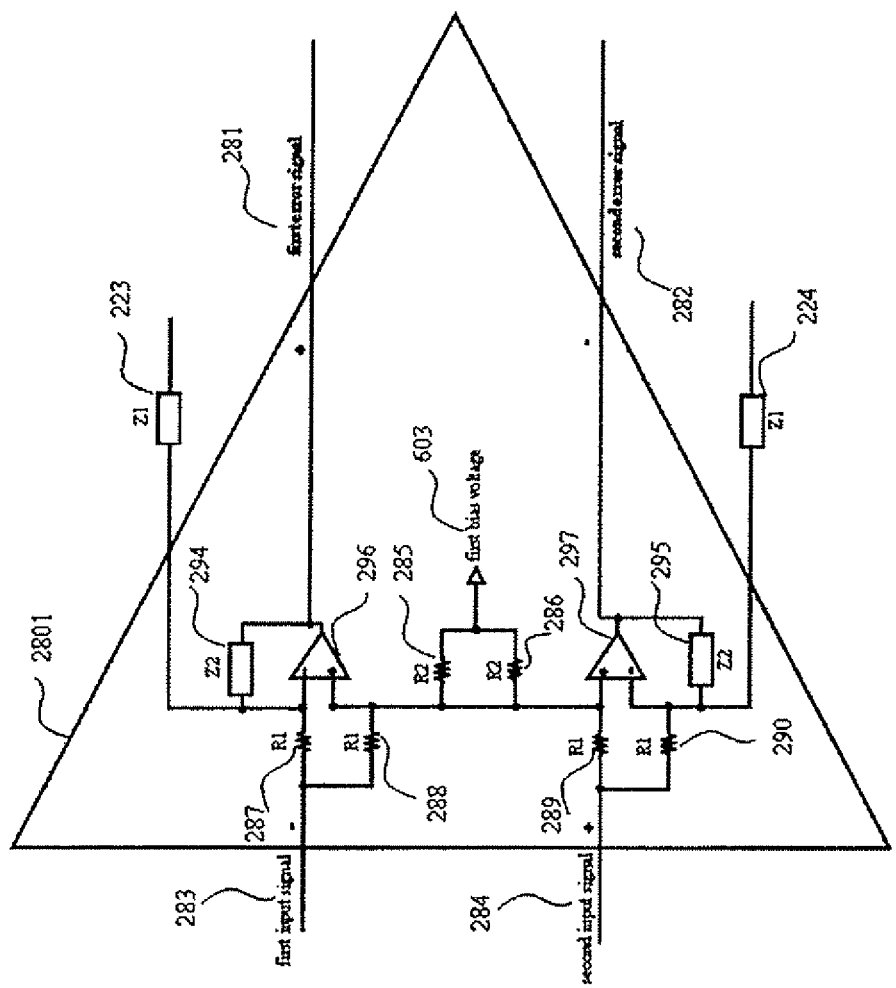
FIG. 5 is a block diagram showing common mode feedforward fully differential error amplifier.

The first embodiment of a fully differential error amplifier is shown in FIG. 5, which is common mode feedforward fully differential error amplifier 2801. Operational amplifier 296, 297 are included in common mode feedforward fully differential error amplifier 2801 to cater for negative differential input signal and positive differential input signal respectively. R1 287 is placed between first input signal 283 and negative input terminal of operational amplifier 296. SW1 291 and R1 288 are connected in series. The other end of SW1 291 is connected to first input signal 283. The other end of R1 288 is connected to positive input terminal of operational amplifier 296. R2 285 is connected between positive input terminal of operational amplifier 296 and a reference voltage, first bias voltage 603. Network Z2 294 is connected between negative input terminal of operational amplifier 296 and output terminal of operational amplifier 295. R1 289 is placed between second input signal 284 and positive input terminal of operational amplifier 297. SW1 293 and R1 290 are connected in series. The other end of SW1 293 is connected to second input signal 284. The other end of R1 290 is connected to negative input terminal of operational amplifier 297. R2 286 is placed between positive input terminal of operational amplifier 297 and a reference voltage, first bias voltage 603. Network Z2 295 is placed between negative input terminal of operational amplifier 297 and output terminal of operational amplifier 297. SW1 292 is placed in series between positive input terminal of operational amplifier 296 and positive input terminal of operational amplifier 297. Feedback network Z1 223 is connected to negative input terminal of operational amplifier 296. Feedback network Z1 224 is connected to negative input terminal of operational amplifier 297. Output terminal of operational amplifier 296 is first error signal 281. Output terminal of operational amplifier 297 is second error signal 282. In BTL mode, SW1 291, SW1 292 and SW1 293 are closed. In OTL mode, SW1 291, SW1 292 and SW1 293 are open. Common mode feedforward fully differential error amplifier 2801 has a symmetrical structure. Feedback signal from feedback network Z1 224 and second input signal 284 are able to propagate to the positive input terminal of operational amplifier 296, which work together with feedback signal from feedback network Z1 223 and first input signal 283 to produce an error reduced signal first error signal 281. Feedback signal from feedback network Z1 223 and first input signal 283 are able to propagate to the positive input terminal of operational amplifier 297, which work together with feedback signal from feedback network Z1 224 and second input signal 284 to produce an error reduced signal second error signal 282. In common mode feedforward fully differential error amplifier, a reference voltage first bias voltage 298 determines the common mode dc level of first error signal and second error signal, which then set common mode dc level of first output signal 283 and second output signal 284 to a predetermined value.

Second Embodiment

Figure 6:
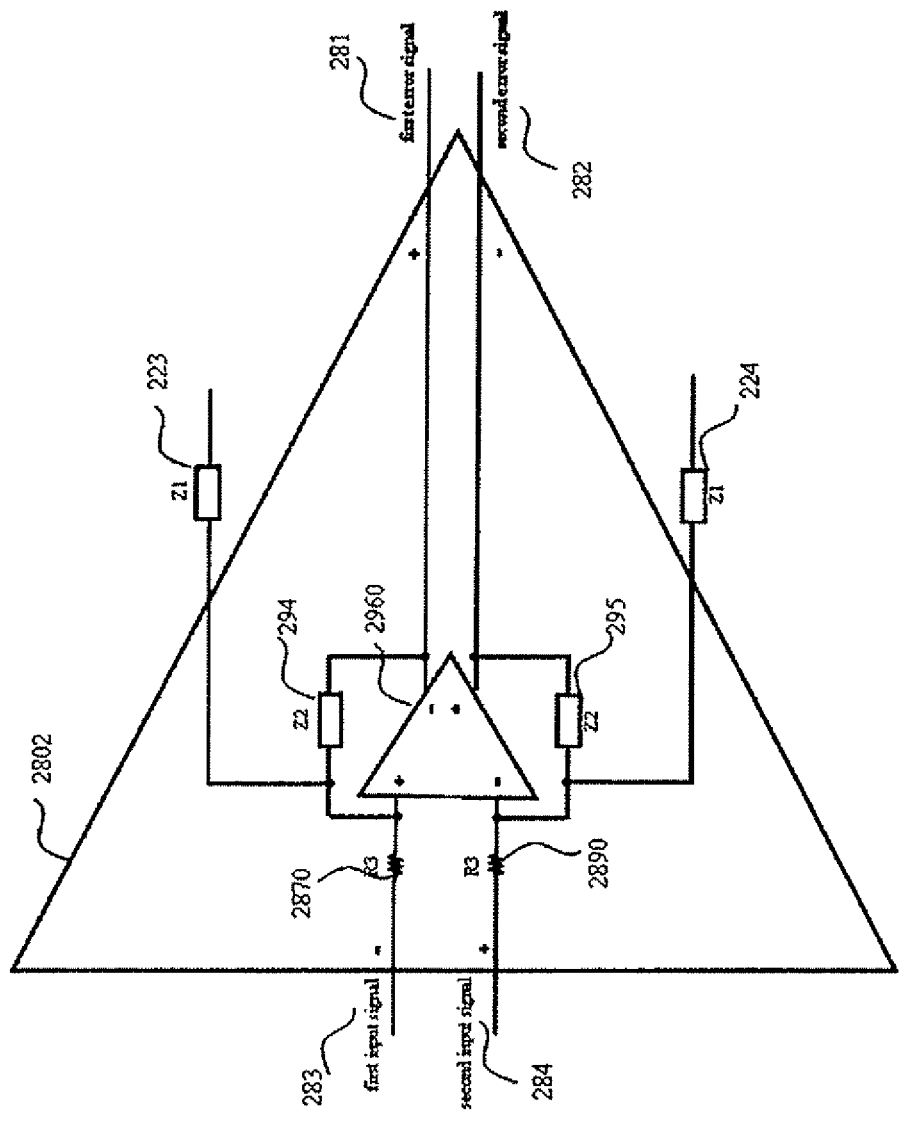
FIG. 6 is a block diagram showing common mode feedback fully differential error amplifier.

The second embodiment of a fully differential error amplifier is shown in FIG. 6, which is common mode feedback fully differential error amplifier 2802. Fully differential amplifier 2960 is included in common mode feedback fully differential error amplifier 2802 to cater for negative differential input signal and positive differential input signal respectively. R3 2870 is placed between first input signal 283 and positive input terminal of fully differential amplifier 2960. Network Z2 294 is placed between negative input terminal of fully differential amplifier 2960 and output terminal of fully differential amplifier 2960. Network 72 295 is placed between negative input terminal of fully differential amplifier 2960 and positive output terminal of fully differential amplifier 2960. Feedback network Z1 223 is connected to negative input terminal of fully differential amplifier 2960. Feedback network Z1 224 is connected to negative input terminal of fully differential amplifier 2960. Negative output terminal of fully differential amplifier 2960 is first error signal 281. Positive output terminal of fully differential amplifier 2960 is second error signal 282. Common mode feedback fully differential error amplifier 2802 has a symmetrical structure. Feedback signal from feedback network Z1 224 and second input signal 284 are able to propagate to the positive input terminal of fully differential amplifier 2960, which work together with feedback signal from feedback network Z1 223 and first input signal 283 to produce an error reduced signal first error signal 281. Feedback signal from feedback network Z1 223 and first input signal 283 are able to propagate to the negative input terminal of fully differential amplifier 2960, which work together with feedback signal from feedback network Z1 224 and second input signal 284 to produce an error reduced signal second error signal 282. In common mode feedback fully differential error amplifier, common mode feedback circuitry determines the common mode dc level of the fully differential error amplifier.

Pop Noise Suppression

Figure 7A:
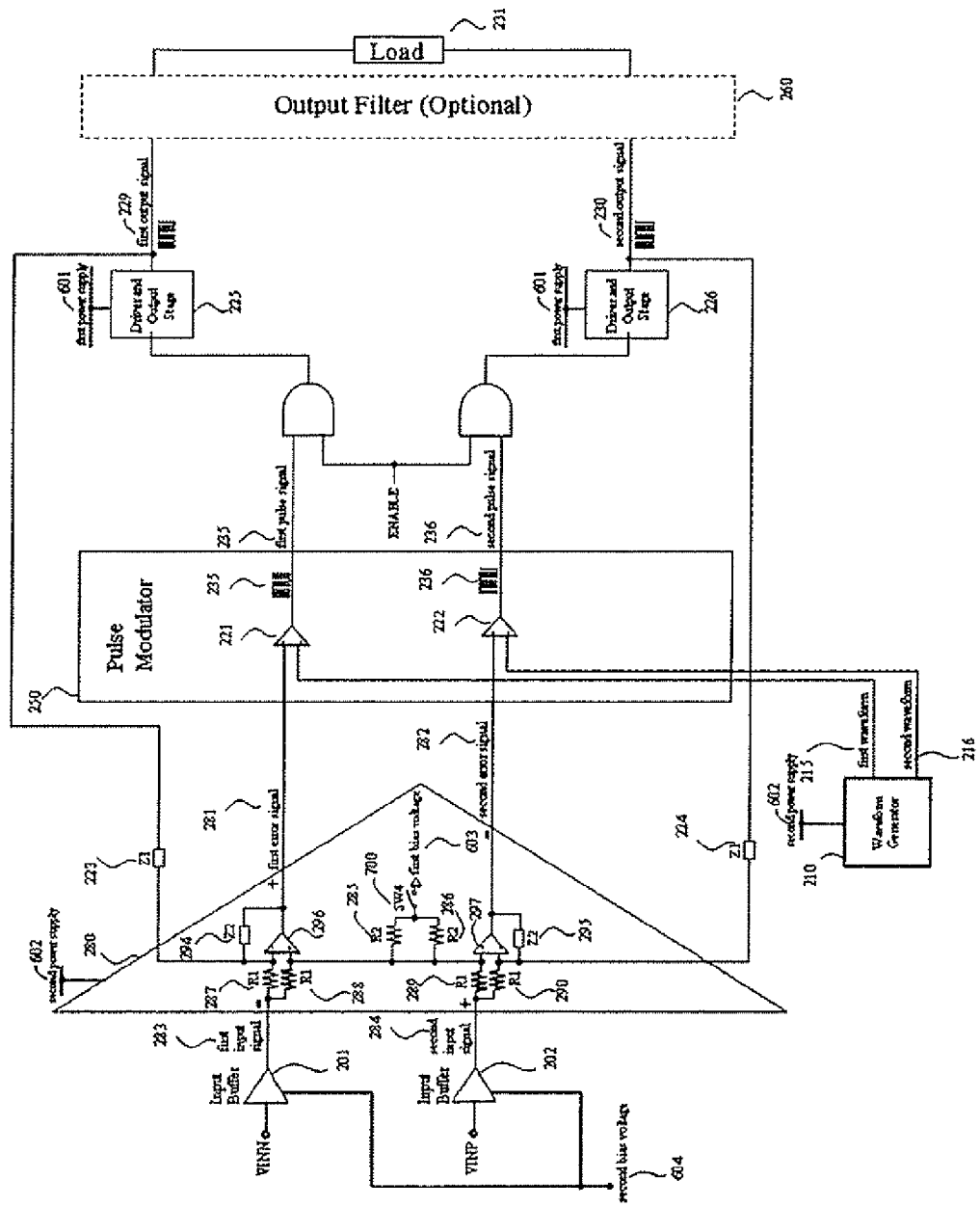
FIG. 7a is a block diagram showing the whole Class D power supply system, dc bias for individual blocks.
Figure 7B:
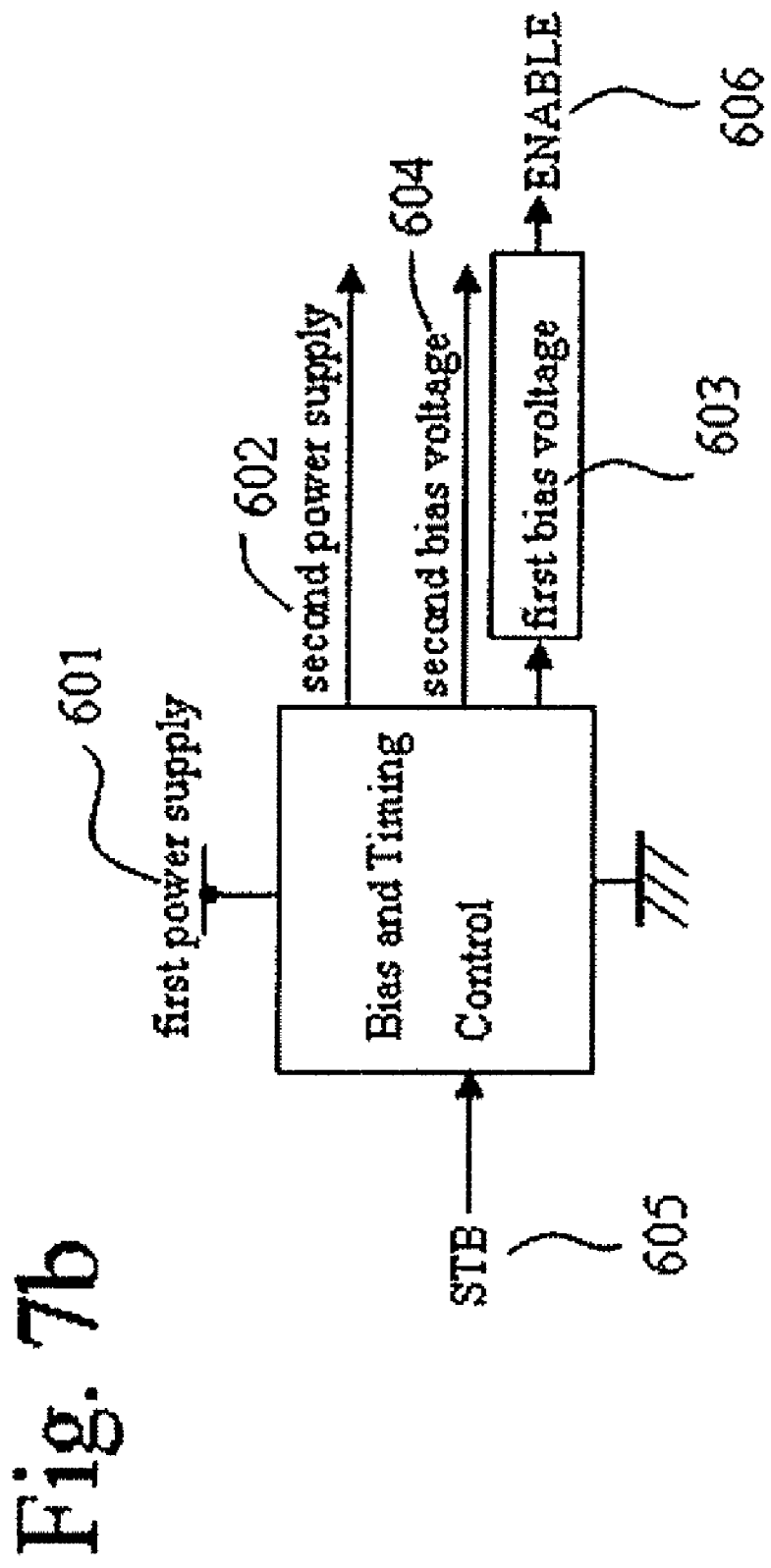
FIG. 7b is a block diagram showing the second power supply, dc bias for individual blocks.

The power supply system and dc bias for individual blocks are illustrated in FIG. 7a. The Class D circuit is a dual power supply system. Second power supply 602 is low voltage power supply, which is to supply power to circuit blocks with low operating voltage. First power supply 601 is high voltage power supply, which is to supply power to output stage so that efficient power is delivered to load. As shown in FIG. 7b, second power supply 602 is an internal generated voltage by first power supply 601. With this arrangement, the dual power supply system can be viewed as a single power supply system. In a single power supply system, it is easy to control the timing sequence of every dc bias and ramping signal with internal time delay circuits and internal logic control signals. As shown in FIG. 7a and FIG. 7b, with first power supply 601 in power on state, after logic control STB 605 selects standby off mode, the whole Class D system is operating in dc bias mode. First bias voltage 603 is charged up to provide dc bias voltage for output stage. Second bias voltage 604 is charged up to provide dc bias voltage for blocks with lower operating voltage. ENABLE 606 is turned on and SW4 700 is closed when first bias voltage 603 is charged up to a predetermined voltage VA 607. Upon the turning on of ENABLE 606, driver and output stage 225 and 226 start switching.

Figure 8:
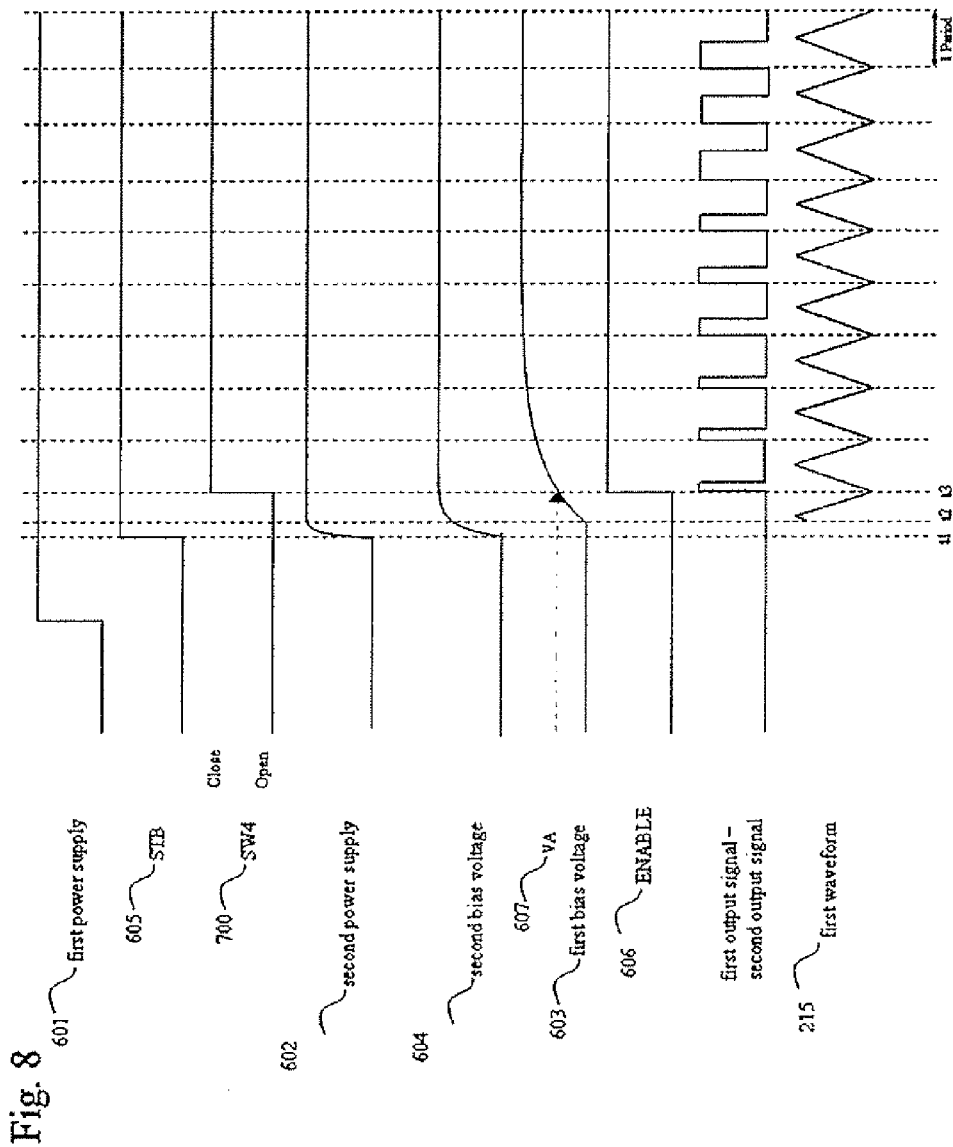
FIG. 8 is a block diagram showing the proper timing sequence of internal circuit bias voltages for the purpose of suppressing pop noise during power on condition.

FIG. 8 shows the proper timing sequence of internal circuit bias voltages for the purpose of suppressing pop noise during power on condition. First power supply 601 is powered on. However, since logic control STB 605 is selecting standby on mode, no internal circuit is operating. At time t1, logic control STB 605 selects standby off mode. Second power supply 602 and second bias voltage 604 both start to rise. Second bias voltage 604 is charged up to half of second power supply 602 voltage at a slower speed in comparison to second power supply 602 rising speed. At time t2, second power supply 602 is first fully charged up to the designed voltage, which supplies power for all lower operating voltage circuit blocks. At time t2, first waveform 215 is generated by waveform generator 210. At time t2, first bias voltage 603 starts to rise at a much slower speed in comparison to second bias voltage 604 rising speed. At time t3, first bias voltage 603 rises to a predetermined voltage VA 607. ENABLE 606 is then turned on, which in consequence enable driver and output stage 225 and 226 start to switch. Since at time t3 first bias voltage 603 reaches a predetermined voltage VA 607, the whole Class D system with feedback is able to work normally, therefore no buzz noise or pop noise is generated.

Figure 9:
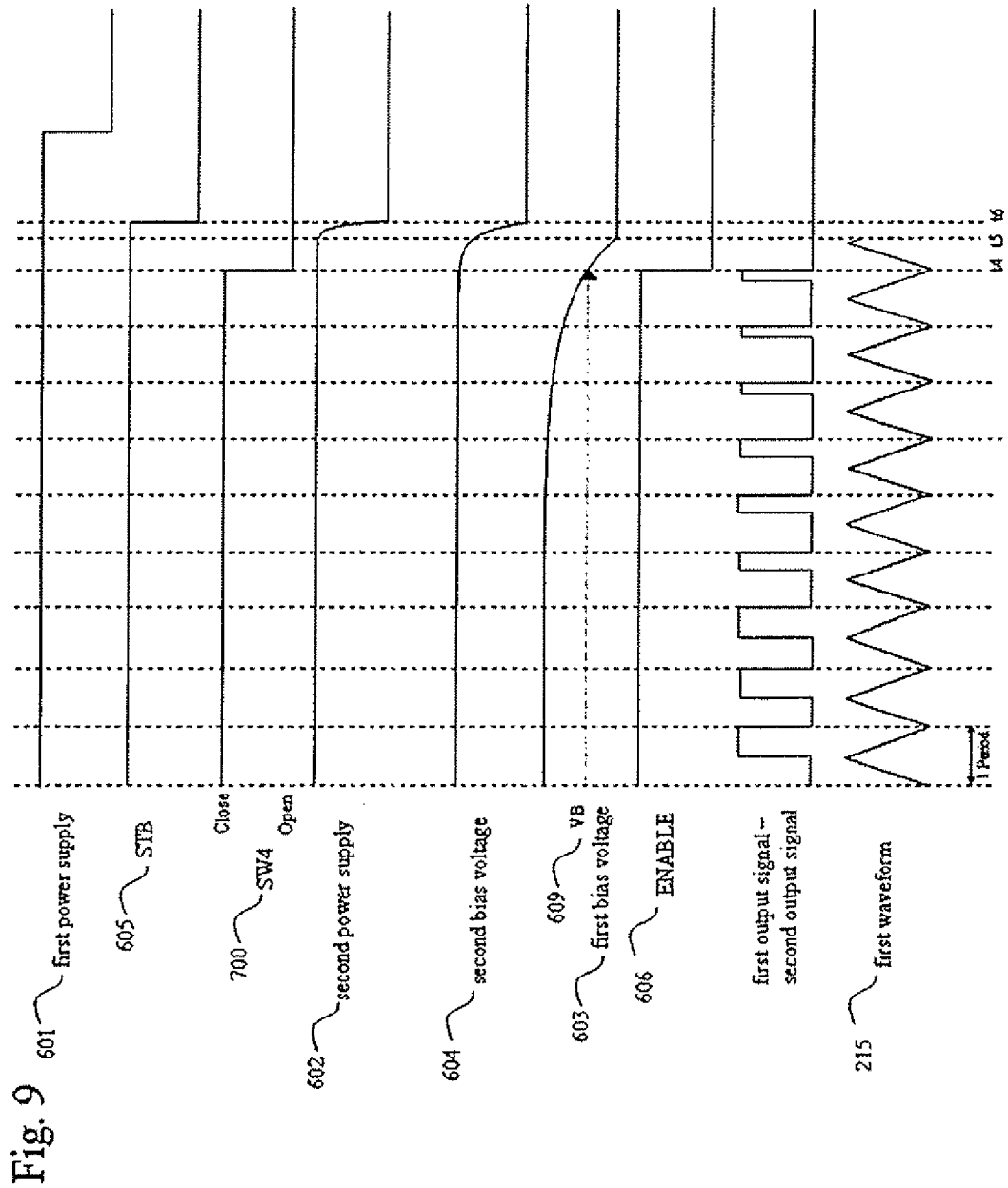
FIG. 9 is a block diagram showing the proper timing sequence of internal circuit bias voltages for the purpose of suppressing pop noise during power off condition.

FIG. 9 shows the proper timing sequence of internal circuit bias voltages for the purpose of suppressing pop noise during power off condition. For easy illustration, easy circuit design and easy explanation, it is shown in FIG. 9 that the timing sequence of internal circuit bias voltages are in reverse relationship as that of internal circuit bias voltages in FIG. 8.

Having described the above embodiment of the invention, various alternations, modifications or improvement could be made by those skilled in the art. Such alternations, modifications or improvement are intended to be within the spirit and scope of this invention. The above description is by ways of example only, and is not intended as limiting. The invention is only limited as defined in the following claims.

What is claimed is:

1. A Class D audio amplifier comprising:
    a differential error amplifier generating a first error signal and a second error signal, wherein said first error signal is a function of first input signal, first output signal, second input signal and second output signal, and wherein said second error signal is a function of second input signal, second output signal, first input signal and first output signal;
    a waveform generator generating a first waveform and a second waveform, wherein said second waveform is at a predetermined phase difference to said first waveform;
    a pulse modulation circuit generating first pulse signal and second pulse signal, wherein said first pulse signal is a function of said first error signal and said first waveform, and wherein said second pulse signal is a function of said second error signal and said second waveform;
    a first driver and output stage generating said first output signal as a function of said first pulse signal;
    a second driver and output stage generating said second output signal as a function of said second pulse signal.

2. The amplifier according to claim 1, wherein said pulse modulation circuit is a pulse width modulated type pulse modulation circuit or other type of pulse modulation circuit.

3. The amplifier according to claim 1, wherein said first input signal and said second input signal can be either a pair of differential signals or two single-ended signals.

4. The amplifier according to claim 1, wherein said first output signal and said second output signal can be connected across a load directly or through an output filter.

5. The amplifier according to claim 1, wherein said differential error amplifier can be implemented by common mode feedforward or common mode feedback or common mode feedback plus common mode feedforward architecture.

6. The amplifier according to claim 5, wherein said common mode feedback differential error amplifier controls the output common mode dc level of said common mode feedback differential error amplifier by a common mode feedback circuitry.

7. The amplifier according to claim 5, wherein said common mode feedforward differential error amplifier sets the output common mode dc level of the said first output signal and said second output signal to a predetermined value in response to a reference voltage or current.

8. The amplifier according to claim 5, wherein said common mode feedback plus common mode feedforward architecture is implemented by said common mode feedback and said common mode feedforward architecture.

9. A method of amplifying an electrical signal comprising:
    forming a first digital signal, and wherein said first digital signal is in response to first input signal, first output signal, second input signal, and second output signal;
    forming a second digital signal, and wherein said second digital signal is a function of said second input signal, said second output signal, said first input signal and said first output signal;
    generating said first output signal in response to said first digital signal;
    generating said second output signal in response to said second digital signal;
    combining the first output signal and the second output signal, and forming an amplified representation of the electrical signal.

10. The method according to claim 9, wherein said first input signal and said second input signal can be either a pair of differential signals or two single-ended signals.

11. The method according to claim 9, wherein said first output signal and said second output signal can be connected across a load directly or through an output filter.

12. A method of providing an amplified representation of an input signal comprising:
    generating a first waveform;
    generating a second waveform;
    generating a first error signal, wherein said first error signal is a function of first input signal, first output signal, second input signal and second output signal;
    generating a second error signal, wherein said second error signal is a function of said second input signal, said second output signal, said first input signal and said first output signal;
    comparing instantaneous values of said first waveform to instantaneous values of said first error signal and forming first pulse signal;
    comparing instantaneous values of said second waveform to instantaneous values of said second error signal and forming second pulse signal;
    subtracting said second pulse signal from said first pulse signal and providing the result as final output.

13. The method according to claim 12, said first input signal and said second input signal can be either a pair of differential signals or two single-ended signals.

14. The method according to claim 12, wherein said final output is connected across a load directly or through an output filter.

15. A Class D audio amplifier comprising:
    a differential error amplifier generating a first error signal and a second error signal, wherein said first error signal is a function of first input signal, first output signal, second input signal and second output signal, and wherein said second error signal is a function of second input signal, second output signal, first input signal and first output signal;

a pulse modulation circuit generating first pulse signal and second pulse signal, wherein said first pulse signal is a function of said first error signal and a first dc reference voltage, and wherein said second pulse signal is a function of said second error signal and a second dc reference voltage;

a first driver and output stage generating said first output signal as a function of said first pulse signal;

a second driver and output stage generating said second output signal as a function of said second pulse signal.

16. The amplifier according to claim 15, wherein said pulse modulation circuit is a self oscillating type or pulse density modulation type.

17. The amplifier according to claim 15, wherein said first input signal and said second input signal can be either a pair of differential signals or two single-ended signals.

18. The amplifier according to claim 15, wherein said first output signal and said second output signal can be connected across a load directly or through an output filter.

19. The amplifier according to claim 15, wherein said differential error amplifier is implemented by common mode feedforward architecture.

20. The amplifier according to claim 15, wherein said common mode feedforward differential error amplifier sets the output common mode dc level of said first output signal and said second output signal to a predetermined value in response to a reference voltage or current.

21. A method of providing an amplified representation of an input signal comprising:

generating a first error signal, wherein said first error signal is a function of first input signal, first output signal, second input signal and second output signal;

generating a second error signal, wherein said second error signal is a function of said second input signal, said second output signal, said first input signal and said first output signal;

comparing instantaneous values of said first error signal to a reference dc voltage and forming first pulse signal;

comparing instantaneous values of said second error signal to said reference do voltage and forming second pulse signal;

subtracting said second pulse signal from said first pulse signal and providing the result as final output.

22. A Class D audio amplifier comprising:

a differential error amplifier generating a first error signal and a second error signal, wherein said first error signal is a function of a first input signal, a first output signal, a second input signal and a second output signal, and wherein said second error signal is a function of the second input signal, the second output signal, the first input signal and the first output signal;

a waveform generator generating a first waveform and a second waveform, wherein said second waveform is at a predetermined phase difference to said first waveform;

a pulse modulator generating a first pulse signal and a second pulse signal, wherein said first pulse signal is a function of said first error signal and said first waveform, and wherein said second pulse signal is a function of said second error signal and said second waveform;

a first driver and output stage generating said first output signal as a function of said first pulse signal;

a second driver and output stage generating said second output signal as a function of said second pulse signal; and a load across said first output signal and said second output signal.

* * * * *